(12) United States Patent
Chen et al.

(10) Patent No.: US 7,777,653 B2
(45) Date of Patent: Aug. 17, 2010

(54) DECODING VARIABLE-LENGTH CODE (VLC) BITSTREAM INFORMATION

(75) Inventors: Liang Chen, Shanghai (CN); Kuan Feng, Shanghai (CN); Huo Ding Li, Liu Zhou (CN); Xing Liu, Shanghai (CN); Rong Yan, Beijing (CN); Yu Yuan, Beijing (CN); Sheng Xu, Shanghai (CN)

(73) Assignee: International Business Machines Corporation, Armonk, NY (US)

( * ) Notice: Subject to any disclaimer, the term of this patent is extended or adjusted under 35 U.S.C. 154(b) by 7 days.

(21) Appl. No.: 12/173,192

(22) Filed: Jul. 15, 2008

(65) Prior Publication Data

US 2010/0013680 A1    Jan. 21, 2010

(51) Int. Cl.
   *H03M 7/40* (2006.01)
(52) U.S. Cl. .................................. 341/67; 341/65
(58) Field of Classification Search ............ 341/65, 341/67
   See application file for complete search history.

(56) References Cited

U.S. PATENT DOCUMENTS

| | | | |
|---|---|---|---|
| 5,878,280 A | 3/1999 | Lucht | |
| 6,308,228 B1 | 10/2001 | Yocum | |
| 6,661,358 B1 * | 12/2003 | Hashimoto | 341/67 |
| 6,982,662 B2 | 1/2006 | Heo | |
| 7,146,458 B2 | 12/2006 | Smirnov | |
| 7,148,821 B2 * | 12/2006 | Thirumoorthy | 341/67 |
| 7,286,066 B1 * | 10/2007 | Ho et al. | 341/67 |
| 2003/0222998 A1 | 12/2003 | Yamauchi | |
| 2004/0233076 A1 | 11/2004 | Zhou | |
| 2007/0024475 A1 | 2/2007 | Kadono | |
| 2007/0115156 A1 | 5/2007 | Lim | |
| 2008/0144717 A1 * | 6/2008 | Zhu et al. | 375/240.16 |

OTHER PUBLICATIONS

Guenther—"Representing Variable-Length Codes in Fixed-Length T-Depletion Format in Encoder and Decoders"—Journal of Universal Computer Science (Aug. 1997).
Hemami—"Resynchronizing Variable-Length Codes for Robust Image Transmission"—Proceedings of the Conference on Data Compression (1999).
Jaspar—"New Iterative Decoding of Variable Length Codes with Turbo-Codes"—UCL and Dept Computer Science and Engineering UC San Diego (Jun. 2004).
Maunder—"On the Perfromance and Complexity of Irregular Variable Length Codes for Near-Capacity Joint Source and Channel Coding"—IEEE Transaction on Wireless Communications, vol. 7, No. 4 (Apr. 2008).

* cited by examiner

*Primary Examiner*—Jean B Jeanglaude
(74) *Attorney, Agent, or Firm*—Matt Talpis; Mark P Kahler

(57) ABSTRACT

An information handling system includes a processor that may perform decoding of a variable-length code (VLC) bitstream after preprocessing the bitstream. The bitstream includes multiple VLC symbols as binary codewords. The processor analyzes incoming VLC bitstream information and generates VLC codeword symbol information in conformance with a VLC lookup table. The processor may access a 2 dimensional VLC lookup table in real time or on-the-fly. The VLC lookup table may reside in a system memory of the IHS. The single VLC lookup table may exhibit two dimensional indexing by leading zero count and bit-length possibility.

17 Claims, 5 Drawing Sheets

FIG. 2
VLC CODEWORD TABLES

VLC CODEWORD SORT BY SYMBOL — 210

| VARIABLE-LENGTH CODE (VLC) CODEWORD | VLC SYMBOL |
|---|---|
| 010 | A |
| 0011 | B |
| 011 | C |
| 00100 | D |
| 1 | E |
| 00101 | F |

220 — 230

VLC CODEWORD SORT BY LEADING ZERO ORDER — 250

| VARIABLE-LENGTH CODE (VLC) CODEWORD | LEADING ZERO COUNT (N) | VLC SYMBOL |
|---|---|---|
| 1 | 0 | E |
| 010 | 1 | A |
| 011 | 1 | C |
| 0011 | 2 | B |
| 00100 | 2 | D |
| 00101 | 2 | F |

VLC CODEWORD SORT BY BIT-LENGTH

| VARIABLE-LENGTH CODE (VLC) CODEWORD | BIT-LENGTH (M) | VLC SYMBOL |
|---|---|---|
| 1 | 1 | E |
| 010 | 2 | A |
| 011 | 2 | C |
| 0011 | 2 | B |
| 00100 | 3 | D |
| 00101 | 3 | F |

FIG. 4

VLC LOOKUP TABLE

| | | P | | | | | | | |
|---|---|---|---|---|---|---|---|---|---|
| | | 000 | 001 | 010 | 011 | 100 | 101 | 110 | 111 |
| N | 0 | -- | -- | -- | -- | E,1 | E,1 | E,1 | E,1 |
| | 1 | -- | -- | -- | -- | A,3 | A,3 | C,3 | C,3 |
| | 2 | -- | -- | -- | -- | D,5 | F,5 | B,4 | B,4 |

VARIABLE-LENGTH CODE (VLC) BITSTREAM DECODING METHOD

DECODING VARIABLE-LENGTH CODE (VLC) BITSTREAM INFORMATION

BACKGROUND

The disclosures herein relate generally to processors, and more specifically, to processors that employ binary bitstream communications in information handling systems.

Modern information handling systems (IHSs) use processors that often generate, interpret, or otherwise manage binary bitstream communications for audio, video or other data forms. Processors may employ fixed-length code (FLC), variable-length code (VLC), or other protocols for the management of binary bitstream data. Table lookup methods exist to provide for decoding of codeword data during VLC bitstream or codeword data transmission. As the complexity of VLC bitstream data increases, lookup tables typically increase in size and thus the memory that processors and IHS's need increases as well. A system may employ software algorithms to decode VLC bitstream codeword data into subsequent VLC symbols as output. In some circumstances, a combination of lookup tables and VLC bitstream analysis performs this decoding task.

Memory use and processor time are significant contributing factors to VLC decoding and therefore directly relate to the maximum operating frequency of modern processors. Lookup table and VLC decoding methods are available to decode VLC bitstream data during run-time operations of a processor and IHS.

BRIEF SUMMARY

Accordingly, in one embodiment, a method of decoding a bitstream is disclosed. The method includes receiving, by a processor, the bitstream wherein the bitstream includes a plurality of codewords. The method also includes generating, by the processor, a, leading zero count (N) and bit-length possibility (P) indexed variable-length code (VLC) lookup table. The method further includes accessing the leading zero count (N) and bit-length possibility (P) indexed variable-length code (VLC) lookup table, by the processor, to decode the plurality of codewords of the bitstream into symbols in real time.

In another embodiment, an information handling system (IHS) is disclosed. The IHS includes a processor that receives a bitstream including a plurality of codewords. The processor generates a leading zero count (N) and bit-length possibility (P) indexed variable-length code (VLC) lookup table. The IHS also includes a memory, coupled to the processor, that stores the leading zero count (N) and bit-length possibility (P) indexed variable-length code (VLC) lookup table generated by the processor from the bitstream. The IHS further includes a processor configured to access the leading zero count (N) and bit-length possibility (P) indexed variable-length code (VLC) lookup table to decode the plurality of codewords of the bitstream into symbols in real time.

BRIEF DESCRIPTION OF THE DRAWINGS

The appended drawings illustrate only exemplary embodiments of the invention and therefore do not limit its scope because the inventive concepts lend themselves to other equally effective embodiments.

FIG. 2 shows VLC codeword tables that depict VLC codewords sorted by VLC symbol and leading zero count (N) information.

FIG. 3 shows VLC codeword tables that depict VLC codewords sorted by bit-length (M) information.

FIG. 4 shows a VLC lookup table that includes VLC symbol and codeword-length (L) information indexed by leading zero count (N) and bit-length possibilities (P).

DETAILED DESCRIPTION

Modern processors often use table lookup techniques and employ VLC codeword decoding methods to increase the communication handling efficiency of the processor. The processor may predefine VLC lookup table data prior to VLC bitstream or VLC codeword communications to increase the decoding speed of VLC binary bitstream information. Although generation of VLC lookup table data prior to VLC codeword communications provides more efficient data communications between processors and devices of IHS's, it may consume memory resources of the processor and IHS. One important feature of an effective VLC lookup table method is the reduction or efficient use of memory resources in an IHS. Complex and possibly multiple lookup table techniques may require extensive memory resources that may further result in processor speed degradation during VLC bitstream analysis and decode. The result may be audio, video, or other data communications that [[are]] suffer in speed or processing time.

Figure 1:
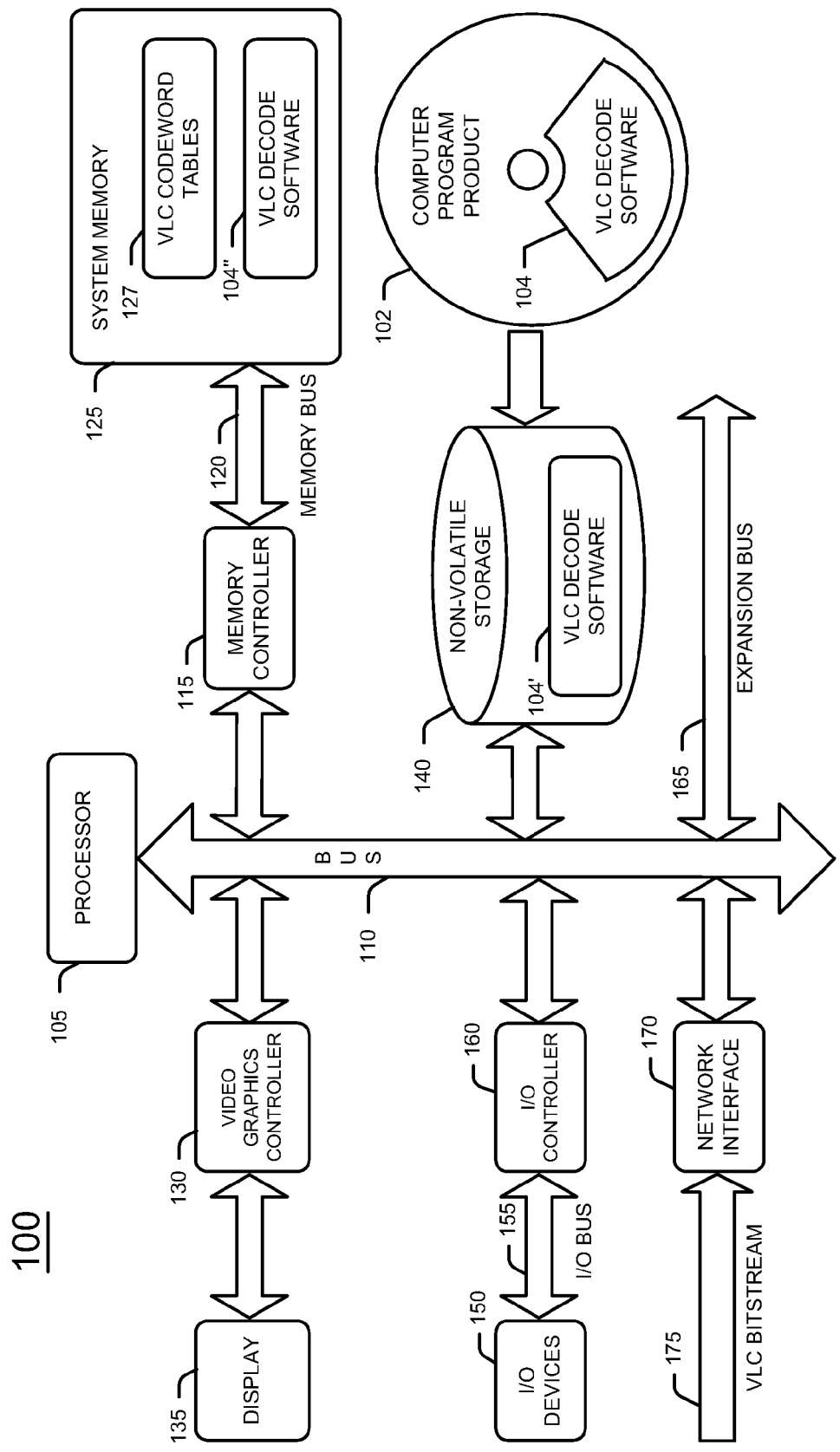
FIG. 1 is block diagram of an information handling system (IHS) that includes the disclosed variable-length code (VLC) lookup table methodology.

FIG. 1 shows an information handling system (IHS) 100 that may employ the disclosed VLC decoding method. In that case, such an IHS carries out the functional blocks of the flowchart of FIG. 5 described below that apply to the VLC decoding process. IHS 100 includes a computer program product 102, such as a media disk, media drive or other media storage. IHS 100 includes VLC decode software 104 that enables processors and other entities to evaluate VLC communications in real time. IHS 100 includes a processor 105 that couples to a bus 110. A memory controller 115 couples to bus 110. A memory bus 120 couples system memory 125 to memory controller 115. System memory 125 includes VLC codeword tables 127 for storage of VLC decoding information. A video graphics controller 130 couples display 135 to bus 110. IHS 100 includes nonvolatile storage 140, such as a hard disk drive, CD drive, DVD drive, or other nonvolatile storage that couples to bus 110 to provide IHS 100 with permanent storage of information. Nonvolatile storage 140 is a form of data store. I/O devices 150, such as a keyboard and a mouse pointing device, couple via an I/O bus 155 and an I/O controller 160 to bus 110.

One or more expansion busses 165, such as USB, IEEE 1394 bus, ATA, SATA, eSATA, PCI, PCIE and other busses, couple to bus 110 to facilitate the connection of peripherals and devices to IHS 100. A network interface 170 couples to bus 110 to enable IHS 100 to connect by wire or wirelessly to other network devices. Network interface 170 receives a VLC bitstream 175 to provide processor 105 with access to VLC bitstream binary codeword data from another processor or source not shown. IHS 100 may take many forms. For example, IHS 100 may take the form of a desktop, server, portable, laptop, notebook, or other form factor computer or data processing system. IHS 100 may also take other form factors such as a personal digital assistant (PDA), a gaming device, a portable telephone device, a communication device or other devices that include a processor and memory.

IHS 100 may employ a compact disk (CD), digital versatile disk (DVD), floppy disk, external hard disk or virtually any other digital storage medium as medium 102. Medium 102 stores software including VLC decode software 104 thereon. A user or other entity installs software such as VLC decode software 104 on IHS 100 prior to usage of this processor application. The designation, VLC decode software 104', describes VLC decode software 104 after installation in non-volatile storage 140 of IHS 100. The designation, VLC decode software 104", describes VLC decode software 104 after IHS 100 loads the VLC decode software into system memory 125 for execution.

Those skilled in the art will appreciate that the various structures disclosed, such as those of VLC decode software 104 may be implemented in hardware or software. Moreover, the methodology represented by the blocks of the flowchart of FIG. 5 may be embodied in a computer program product, such as a media disk, media drive or other media storage such as computer program product medium 102 of FIG. 1.

In one embodiment, the disclosed methodology is implemented as VLC decode software 104, namely a set of instructions (program code) in a code module which may, for example, be resident in the system memory 125 of IHS 100 of FIG. 1. Until required by IHS 100, the set of instructions may be stored in another memory, for example, non-volatile storage 140 such as a hard disk drive, or in a removable memory such as an optical disk or floppy disk, or downloaded via the Internet or other computer network. Thus, the disclosed methodology may be implemented in a computer program product for use in a computer such as IHS 100. It is noted that in such a software embodiment, code which carries out the functions described in the flowchart of FIG. 5 may be stored in RAM or system memory 125 while such code is being executed. In addition, although the various methods described are conveniently implemented in a general purpose computer selectively activated or reconfigured by software, one of ordinary skill in the art would also recognize that such methods may be carried out in hardware, in firmware, or in more specialized apparatus constructed to perform the required method steps.

Table 1 below represents one example of a bitstream or variable-length code (VLC) codeword binary bitstream, such as VLC bitstream 175. A processor, such as processor 105 of IHS 100 may receive such a VLC bitstream and decode that VLC bitstream data into corresponding VLC symbols and ultimately into audio, video, or other information.

TABLE 1

| | Binary bitstream codeword data |
|---|---|
| VLC bitstream | 100110110100010000101 |

VLC bitstream 175 includes a series or sequence of binary bits, such as those of Table 1 above, namely 100111110100010000101. Prior to VLC bitstream 175 communication or reception, processor 105 may generate lookup table data such as those of FIGS. 2-3 described below. Lookup tables may reside in the system memory 125 of IHS 100 as VLC codeword tables 127. During this pre-process or pre-decode period, processor 105 evaluates VLC bitstream 175 for each unique codeword for subsequent decode or interpretation. Processor 105 may predefine lookup table data that processor 105 determines from prior communications or other VLC codeword analysis. During pre-processing, processor 105 may sort VLC codeword data of VLC bitstream 175 to correspond with VLC symbol data. Each VLC codeword may correspond with a respective VLC symbol.

FIG. 2 depicts an example of lookup table data that processor 105 generates during pre-processing of VLC bitstream data. In other words, processor 105, when executing VLC decode software 104, generates VLC codeword table 210 from VLC bitstream 175 data analysis or other sources. VLC codeword table 210 includes VLC codeword and symbol data. For example, VLC codeword table 210 includes a VLC codeword column 220 that includes each binary VLC codeword of VLC bitstream 175. VLC codeword column 220 includes entries for 6 VLC codewords, namely 010, 0011, 011, 011, 00100, 1, and 00101 shown as binary data therein. Column 230 shows corresponding VLC symbol data A through F for each VLC codeword of column 220. Stated in another manner, processor 105 decodes the particular binary data of VLC bitstream 175 into a series or sequence of particular VLC symbols. For purposes of this example, VLC codeword and symbol table 210 provides one set of possible VLC symbols that a VLC codeword decoding method may generate. In modern systems, both VLC codewords and VLC symbols may vary greatly in length, content and complexity. From the VLC codeword and VLC symbol information of VLC codeword and symbol table 210, processor 105 may count leading zero data for each VLC codeword.

Processor 105 may generate a VLC codeword table 250 that includes VLC codewords in leading zero order, as shown in FIG. 2. VLC codeword table 250 demonstrates a VLC codeword sort by leading zeros order, with a secondary sort on the binary VLC codeword itself. VLC codeword table 250 includes a VLC codeword column 260. VLC codeword column 260 includes each VLC codeword that processor 105 identifies from the input of VLC bitstream 175. Column 260 includes VLC codewords 1, 010, 011, 0011, 0010, and 00101 as binary data entries. VLC codeword table 250 includes leading zero count (N) column 270 of data 0, 1, 1, 2, 2, and 2. N refers to the number of binary 0's that precede any binary 1's in the VLC codeword data as seen in column 260. VLC codeword table 250 also includes VLC symbol data column 280 of data E, A, C, B, D and F. In this example of VLC codewords in leading zero order, N corresponds to the number of leading zeros or leading zero count for each VLC codeword of VLC codeword table 210 above. In other words, processor 105 first sorts the VLC codeword data of VLC codeword table 210 above by leading zero count (N) and then sorts that result by VLC codeword to generate the data order of VLC codeword table 250.

After processor 105 generates the data as seen in the first two columns of codeword table 250, namely column 260 and 270 data, processor 105 may further organize the VLC codeword data to include codeword bit-length (M). Codeword bit-length (M) is the binary bit count of the original VLC codeword without the leading zero data. In other words, M is the number of bits that each VLC codeword exhibits without any leading zeros. One such example, using the data from codeword table 210 and codeword table 250 is shown in the VLC codeword bit-length (M) table example of FIG. 3.

FIG. 3 depicts a VLC codeword table 310 with corresponding bit-length (M) data. Column 320 includes VLC codewords 1, 010, 011, 0011, 00100, and 00101 as shown in FIG. 2 column 260 also. FIG. 3 includes bit-length (M) column 330 of data 1, 2, 2, 2, 3, and 3 that correspond to each particular VLC codeword of column 320. The corresponding VLC symbols, E, A, C, B, D, and F do not change in order or sequence to that of codeword table 250 above. The total VLC codeword-length (L) may further be shown to be the sum of leading zero count (N) plus bit-length (M) for each VLC codeword of FIG. 3. Processor 105 may store the information of codeword tables 210, 250 and 310 of FIGS. 2 and 3 above in memory of IHS 100. For example codeword table data may store in system memory 125 or more particularly in VLC codeword tables 127. Processor 105 may store codeword table data in system memory 125, register files, system RAM or any other memory locations.

FIG. 4 depicts a VLC codeword table or more specifically a VLC lookup table 410. Processor 105, when executing VLC decode software 104, generates VLC lookup table 410 from decode analysis of VLC bitstream 175. VLC lookup table 410 may reside in system memory 125, such as VLC codeword tables 127 of IHS 100 for access by processor 105 during VLC bitstream 175 decoding. VLC lookup table 410 includes N data in column 420 of 0, 1, and 2. VLC lookup table 410 includes bit-length (M) as bit-length possibilities (P) data in row 430 of 000, 001, 010, 011, 100, 101, 110, and 111. VLC lookup table 410 is a leading zero count (N) and bit-length possibility (P) indexed variable-length code (VLC) lookup table. In one embodiment, P data in row 430 includes all possible binary combinations of the largest bit-length size (M-max) or 3 bits of binary bitstream data that VLC bitstream 175 may include. In other embodiments M may have values of less than or greater than 3 in correspondence with the particular binary bitstream data or VLC decoding application. VLC lookup table 410 uses N and P as the indexes or lookup values for each data element therein. The data elements of VLC lookup table 410 include a VLC symbol (such as E) and total VLC codeword-length (L) data value (such as 1). Representative VLC lookup table 410 includes data element values for N=0 of E,1 for P=100, 101, 110 and 111.

VLC lookup table 410 includes data element values for N=1 of A,3 for P=100 and 101. VLC lookup table 410 includes data element values for N=1 of C,3 for P=110 and 111. VLC lookup table 410 includes a data element value of D,5 for N=2 and P=100, a data element value of F,5 for N=2 and P=101, and a data element value of B,4 for N=2 and P=110 and 111. In one example, VLC lookup table 410 represents a 2 dimensional indexed array. N and P represent the 2 dimensions that processor 105 uses to index VLC lookup table 410. The data element values for N of 0, 1, and 2 that correspond to P values of 000, 001, 010, and 011 are empty. In the example of FIG. 4, VLC lookup table 410 is a single 2 dimensional table. The use of VLC lookup table 410 will be described in more detail below.

Figure 5:
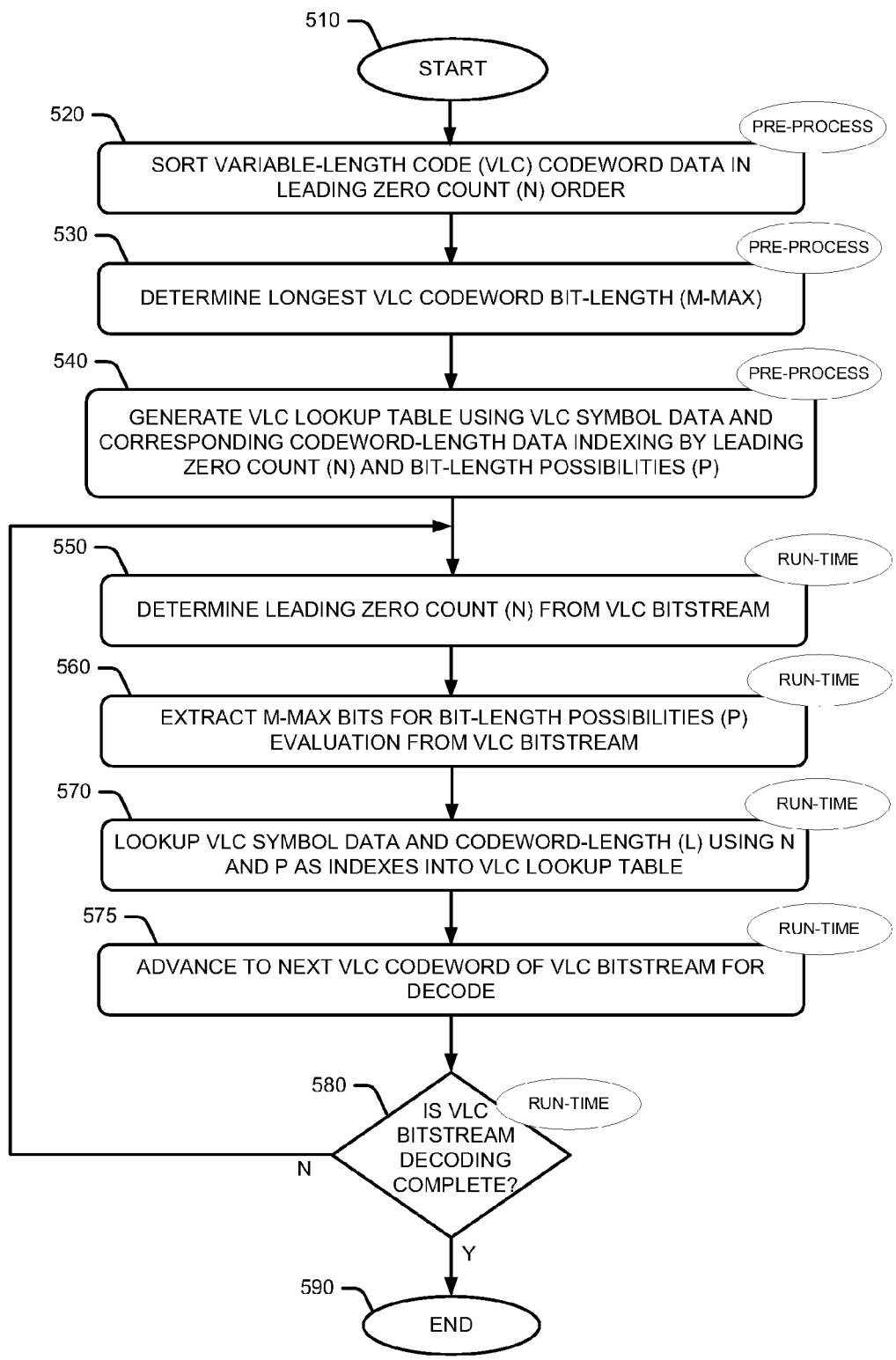
FIG. 5 is a flowchart that shows process flow in the processor of FIG. 1 as it employs the disclosed variable-length code (VLC) bitstream decoding method.

FIG. 5 shows a flowchart that describes one example of the disclosed variable-length code (VLC) bitstream decoding method. Processor 105 receives a VLC binary codeword bitstream, such as VLC bitstream 175, from another processor or other source. VLC bitstream 175 may contain VLC codeword data such as the data of codeword table 210, described above with reference to FIG. 2. That VLC codeword data may be in the form as shown in Table 1 above as a binary string of 0 and 1 digits. In an effort to decode VLC bitstream 175, processor 105 may interpret incoming VLC data and organize the results into a series of VLC symbols such as the VLC symbol data shown in VLC codeword table 210 above. The VLC bitstream decoding method begins, as per block 510. Prior to VLC codeword decoding, processor 105 executes VLC decode software 104 to sort VLC codeword data of VLC bitstream 175 in leading zero count (N) order, as per block 520. The N sort is part of a pre-process operation that processor 105 executes prior to VLC bitstream 175 decoding. Processor 105 sorts VLC codeword data by N, and generates information in conformance with codeword table 250, described above with reference to FIG. 4. Processor 105 may store codeword table 250 data in VLC codeword tables 127 of IHS 100.

Processor 105 determines the longest or widest VLC codeword bit-length or value of M as M-max, as per block 530. In the example of the data as depicted above in FIGS. 2 and 3, that M-max value is equal to 3. In other words, in the total VLC codeword binary bitstream of VLC bitstream 175, as shown in codeword table 310 of FIG. 3, M-max or a value of 3 represents the largest number of consecutive binary digits that processor 105 receives after the leading zeros for each codeword. After evaluating all possible VLC codewords from VLC bitstream 175, processor 105 possesses sufficient information to generate VLC lookup table 410, as per block 540.

More specifically, for all VLC bitstream 175 codeword possibilities that correspond to M-max or 3 bits in size, namely 000, 001, 010, 011, 100, 101, 110, and 111, processor 105 generates VLC lookup table 410. Processor 105 generates a column of lookup table data entry for each value of P or the possible bit-length (M) binary values of VLC bitstream 175. Processor 105 includes data elements of VLC symbol and L values per N and P indexes in VLC lookup table 410. Processor 105 may store VLC lookup table 410 in VLC codeword table 127 of IHS 100. In other words, processor 105 may generate the data of VLC codeword table 410 by using VLC symbol data and corresponding VLC codeword-length (L) data and indexing that information with leading zero count N and bit-length possibilities (P). VLC bit-length possibilities (P) is the group of VLC codeword data or column headers as in VLC lookup table 410. Each VLC symbol data value, namely A through F as per codeword table 210 above, resides in one or more locations or data entry areas of VLC lookup table 410.

To better understand the organization of VLC lookup table 410, an example for one VLC symbol is described below. For example, if VLC symbol A is binary 10, then 100 and 101 may be VLC symbol A followed by one binary bit from the next VLC symbol of VLC bitstream 175. Therefore, 100 and 101 are possible indexes for VLC symbol A. Stated in another way, 100 and 101 represent M bit-length possibilities (P) for VLC symbol A. VLC lookup table 410, that processor 105 generates and stores in IHS memory, indexes the VLC symbol and codeword-length (L) by N and P. In another example, in any particular bitstream, a codeword of 110 or 111 may be 11 followed by other binary data and thus VLC symbol C followed by other data. In that example both 110 and 111 represent VLC codeword bit-length possibilities (P) for VLC symbol C. By choosing P lengths of 3 or M-max, all possible codeword bit-lengths (M) are shown in the example of VLC lookup table 410 of FIG. 4.

During decoding or run-time operation, processor 105 generates VLC symbol data from VLC codeword data on-the-fly or in real time processor execution. Processor 105 executes VLC decode software 104 to determine N, namely the leading zero count, from the VLC codeword data of VLC bitstream 175, as per block 550. For example, using the data of Table 1 above, the first binary digit in VLC bitstream 175 binary data is 1. In that case, there is no leading zero and N=0. Processor 105 extracts M-max or 3 bits as P for evaluation from VLC bitstream 175, as per block 560. In the above example that uses the VLC bitstream data of Table 1, the first 3 bits of VLC bitstream 175 and therefore the value of P is binary 100. Processor 105 performs a lookup of VLC codeword data of VLC bitstream 175 using N and P as indexes into VLC lookup table 410, as per block 570. In the case wherein N=0, and P=100, as per VLC lookup table 410, memory of IHS 100 provides a result of E,1. Stated alternatively, processor 105 executes a lookup into IHS 100 memory with indexes of N=0, and P=100 resulting in a VLC lookup table 410 result of VLC symbol E and VLC codeword-length of 1. With that decoding of E as the first VLC codeword symbol, processor 105 may now move to the next VLC codeword information in VLC bitstream 175 on-the-fly or in real-time processor operation. Using the VLC codeword-length value of 1, processor 105 advances 1 binary bit to the start of the next VLC codeword of VLC bitstream 175 for decoding, as per block 575.

If the VLC bitstream decoding is not complete, flow returns to block 550 and processor 105 continues decoding the next binary bits of VLC bitstream 175, as per decision block 580. As processor 105 decodes each VLC codeword of VLC bitstream 175 of Table 1 above, the output corresponds to VLC symbol data of "EBCADF", as shown in Table 2 below. If the VLC codeword decoding is complete at decision block 580, the VLC bitstream decoding method ends, as per block 590. Table 2 below shows the resultant VLC symbol data "EBCADF" that processor 105 decodes from the VLC bitstream example.

TABLE 2

| | |
|---|---|
| VLC bitstream (binary codeword data) | 100110110100010000101 |
| VLC symbol data | EBCADF |

The foregoing discloses methodologies wherein a processor may employ VLC decoding software to provide VLC bitstream decoding on-the-fly using a VLC lookup table. A processor within an IHS may employ system memory for storage of codeword table data for analysis and decoding of VLC bitstream information that the IHS receives as input.

Modifications and alternative embodiments of this invention will be apparent to those skilled in the art in view of this description of the invention. Accordingly, this description teaches those skilled in the art the manner of carrying out the invention and is intended to be construed as illustrative only. The forms of the invention shown and described constitute the present embodiments. Persons skilled in the art may make various changes in the shape, size and arrangement of parts. For example, persons skilled in the art may substitute equivalent elements for the elements illustrated and described here. Moreover, persons skilled in the art after having the benefit of this description of the invention may use certain features of the invention independently of the use of other features, without departing from the scope of the invention.

What is claimed is:

1. A method of decoding a bitstream, comprising:
   receiving, by a processor, the bitstream, wherein the bitstream includes a plurality of variable length code (VLC) codewords;
   generating, by the processor, a variable-length code (VLC) lookup table that is indexed by both leading zero count (N) and bit-length possibility (P), the VLC lookup table including data elements, each data element including a respective VLC symbol and a respective VLC codeword length (L); and
   accessing the variable-length code (VLC) lookup table, by the processor, using the leading zero count (N) for codewords in the bitstream as a first index and the bit-length possibility (P) for the codewords as a second index to decode the codewords of the bitstream into respective symbols and respective VLC codeword lengths in real time.

2. The method of claim 1, further comprising determining, by the processor, from a particular codeword the leading zero count (N) of that particular codeword.

3. The method of claim 1, further comprising determining, by the processor, an M-max number of bits for a particular codeword.

4. The method of claim 1, further comprising determining, by the processor, a bit-length possibility (P) for a particular codeword.

5. The method of claim 1, further comprising storing, by the processor, the leading zero count (N) and bit-length possibility (P) indexed variable-length code (VLC) lookup table in a system memory.

6. The method of claim 1, further comprising utilizing, by the processor, the VLC codeword-length (L) of a particular decoded codeword to advance to the next codeword of the bitstream after the particular decoded codeword.

7. An information handling system (IHS), comprising
   a processor that receives a bitstream including a plurality of variable length code (VLC) codewords, wherein the processor generates a variable-length code (VLC) lookup table that is indexed by both leading zero count (N) and bit-length possibility (P), the VLC lookup table including data elements, each data element including a respective VLC symbol and a respective VLC codeword length (L);
   a memory, coupled to the processor, that stores the variable-length code (VLC) lookup table generated by the processor from the bitstream;
   the processor being configured to access the variable-length code (VLC) lookup table, using the leading zero count (N) for codewords in the bitstream as a first index and the bit-length possibility (P) for the codewords as a second index to decode the codewords of the bitstream into respective symbols and respective VLC codeword lengths in real time.

8. The IHS of claim 7, wherein the processor stores the leading zero count (N) and bit-length possibility (P) indexed variable-length code (VLC) lookup table in a system memory.

9. The IHS of claim 7, wherein the processor determines from a particular codeword the leading zero count (N) of that particular codeword.

10. The IHS of claim 7, wherein the processor determines an M-max number of bits for a particular codeword.

11. The IHS of claim 7, wherein the processor determines a bit-length possibility P for a particular codeword.

12. The IHS of claim 7, wherein the processor utilizes the VLC codeword-length (L) of a particular decoded codeword to advance to the next codeword of the bitstream after the particular decoded codeword.

13. A computer program product stored on a computer readable medium, comprising:
   instructions that receive a bitstream including a plurality of variable length code (VLC) codewords;
   instructions that generate from the bitstream a 2 dimensional variable-length code (VLC) lookup table that is indexed by both leading zero count (N) and bit-length possibility (P), the variable-length code (VLC) lookup table including data elements, each data element including a respective VLC symbol and a respective VLC codeword length (L); and
   instructions that access the variable-length code (VLC) lookup table using the leading zero count (N) for codewords in the bitstream as a first index and the bit-length possibility (P) for the codewords in the bitstream as a second index to decode the codewords of the bitstream into respective symbols and respective VLC codeword lengths in real time.

14. The computer program product of claim 13, further comprising instructions that utilize the codeword-length (L) of a particular codeword to advance to the next codeword of the bitstream after the particular codeword.

15. The computer program product of claim 13, further comprising instructions that determine a bit-length possibility (P) for a particular codeword.

16. The computer program product of claim 13, further comprising instructions that determine from a particular codeword the leading zero count (N) of that particular codeword.

17. The computer program product of claim 13, further comprising instructions that determine an M-max number of bits for a particular codeword.

* * * * *